(12) United States Patent
Kim et al.

(10) Patent No.: US 8,644,437 B2
(45) Date of Patent: Feb. 4, 2014

(54) DIGITAL COMPENSATION OF A NONLINEAR SYSTEM

(75) Inventors: Helen H. Kim, Sudbury, MA (US); Merlin R. Green, Salem, MA (US); Benjamin A. Miller, Cambridge, MA (US); Andrew K. Bolstad, Arlington, MA (US); Andrew R. Chen, Newton, MA (US); Daniel D. Santiago, Waltham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 230 days.

(21) Appl. No.: 13/227,583

(22) Filed: Sep. 8, 2011

(65) Prior Publication Data

US 2012/0176191 A1 Jul. 12, 2012

Related U.S. Application Data

(60) Provisional application No. 61/430,934, filed on Jan. 7, 2011.

(51) Int. Cl.
*H04B 1/10* (2006.01)

(52) U.S. Cl.
USPC ........... 375/350; 375/232; 375/259; 375/296; 375/316; 375/343

(58) Field of Classification Search
USPC ......... 375/229, 232, 259, 295, 296, 302, 316, 375/343, 350
See application file for complete search history.

(56) References Cited

U.S. PATENT DOCUMENTS

| 5,594,612 | A | 1/1997 | Henrion | |
|---|---|---|---|---|
| 7,129,874 | B2 * | 10/2006 | Bjornsen | 341/143 |
| 7,460,613 | B2 * | 12/2008 | Sahlman | 375/296 |
| 7,577,211 | B2 * | 8/2009 | Braithwaite | 375/296 |
| 8,301,104 | B1 * | 10/2012 | Gupta et al. | 455/296 |
| 8,410,960 | B2 * | 4/2013 | Hekstra et al. | 341/118 |
| 2005/0219089 | A1 * | 10/2005 | Batruni | 341/118 |
| 2006/0273942 | A1 * | 12/2006 | Koste et al. | 341/118 |
| 2008/0130787 | A1 * | 6/2008 | Copeland | 375/297 |
| 2008/0258949 | A1 * | 10/2008 | Galton et al. | 341/120 |
| 2008/0270062 | A1 * | 10/2008 | Laraia et al. | 702/104 |

(Continued)

OTHER PUBLICATIONS

Yoshizawa, "Anti-Blocker Design Techniques for MOSFET-C Filters for Direct Conversion Receivers," IEEE J. Solid-State Circuits, vol. 37, No. 3, pp. 357-364, Mar. 2002; 8 pgs.

(Continued)

*Primary Examiner* — Hirdepal Singh
(74) *Attorney, Agent, or Firm* — Schmeiser, Olsen & Watts, LLP

(57) ABSTRACT

A method for digital compensation of a nonlinear system comprises identifying a plurality of circuit parameters of a nonlinear system. Each circuit parameter determines a nonlinear response of the nonlinear system. A first circuit parameter is chosen from the plurality of circuit parameters. The first circuit parameter determines a first effect on the nonlinear response. The first effect is at least as large a second effect from a second circuit parameter from the plurality of circuit parameters. At least one stimulus is applied to the nonlinear system. The nonlinear response of the nonlinear system is measured in response to the at least one stimulus. A compensation architecture is synthesized to substantially linearize the nonlinear response. The compensation architecture receives the nonlinear response of the nonlinear system and provides a substantially linear response.

20 Claims, 8 Drawing Sheets

(56) References Cited

U.S. PATENT DOCUMENTS

| | | | |
|---|---|---|---|
| 2011/0004885 A1* | 1/2011 | Kikuchi et al. | 718/104 |
| 2011/0122005 A1* | 5/2011 | Hekstra et al. | 341/118 |
| 2011/0304392 A1* | 12/2011 | Zanchi | 330/253 |
| 2012/0154038 A1* | 6/2012 | Kim et al. | 330/149 |

OTHER PUBLICATIONS

D'Amico, "A CMOS 5nV/√Hz 74-dB-Gain-Range 82-dB-DR Multistandard Baseband Chain for Bluetooth, UMTS, and WLAN," IEEE J. Solid-State Circuits, vol. 43, No. 7, pp. 1534-1541, Jul. 2008; 8 pgs.

Behbahani, "A Broad-Band Tunable CMOS Channel-Select Filter for a Low-IF Wireless Receiver," IEEE J. Solid-State Circuits, vol. 35, No. 4, pp. 476-489, Apr. 2000; 14 pgs.

Goodman, "Polyphase Nonlinear Equalization of Time-Interleaved Analog-to-Digital Converters," IEEE J. Selected Topics in Signal Processing, vol. 3, No. 3, pp. 362-373, Jun. 2009; 12 pgs.

Baschirotto, "Advances on Analog Filters for Telecommunications," IEEE ASPCAS, pp. 131-168, 2006; 38 pgs.

Quinn, "A Cascode Amplifier Nonlinearity Correction Technique," IEEE Int'l Solid State Circuits Conference, Feb. 1981; 3 pgs.

Morgan, "A Generalized Memory Polynomial Model for Digital Predistortion of RF Power Amplifiers," IEEE Trans. on Signal Processing, vol. 54, No. 10, Oct. 2006; 9 pgs.

International Search Report and Written Opinion in counterpart international patent application No. PCT/US2011/067222, dated Apr. 20, 2012; 13 pages.

Taherzadeh-Sani M., et al., "Power Optimization of Pipelined ADCs with High-Order Digital Gain Calibration", 14th IEEE International Conference on Electronics, Circuits and Systems, Dec. 2007, pp. 661-664. Only Abstract is attached.

Iizuka, K., et al., "A 14-bit Digitally Self-Calibrated Pipelined ADC with Adaptive Bias Optimization for Arbitrary Speeds up to 40 MSs/s", IEEE Journal of Solid-State Circuits, vol. 41, issue 4, Apr. 2006, pp. 883, 890. Only Abstract is attached.

International Preliminary Report on Patentability in relation to International patent application No. PCT/US2011/067222, mailed on Jul. 18, 2013; 7 pages.

* cited by examiner

DIGITAL COMPENSATION OF A NONLINEAR SYSTEM

CROSS-REFERENCE TO RELATED APPLICATIONS

This application is a utility application claiming priority to U.S. Provisional Application Ser. No. 61/430,934 filed on Jan. 7, 2011 entitled "ACTIVE ANTI-ALIAS FILTER WITH NONLINEAR DIGITAL EQUALIZATION," the entirety of which is incorporated by reference herein.

GOVERNMENT RIGHTS IN THE INVENTION

This invention was made with government support under grant number FA8721-05-C-0002 awarded by the Air Force. The government has certain rights in this invention.

FIELD OF THE INVENTION

The invention relates generally to digital equalizers. More specifically, the invention relates to digital equalization of nonlinear systems including targeted control of specific circuit parameters of the nonlinear systems.

BACKGROUND

Nonlinear systems can be used to detect small signals in the presence of signals with significantly larger amplitudes. Such detection typically requires a high spur-free dynamic range (SFDR), which is a measure of the amplitude of the fundamental with respect to the amplitude of the largest harmonic tone or spur. These nonlinear systems can include several nonlinear functions that interact with one another to provide the desired output. One example is a radio frequency (RF) system with an RF receiver, an analog to digital converter (ADC) driver, an anti-alias filter and an ADC. The RF system receives a signal and converts it into the digital domain with the ADC. An anti-alias filter is required to remove high frequency tones that can alias into the baseband frequency range when subsequently sampled by the ADC.

ADC designers and manufacturers often focus on improving ADC linearity, without regard to the nonlinear distortion created by the other functions in the RF system signal chain, for example the RF receiver, ADC driver and anti-alias filter. Achieving a desired SFDR for a nonlinear system is best achieved when each function of the system is properly balanced with respect to SFDR because the system is only as strong as the weakest link. For example, with reference to FIG. 1A, a 16-bit ADC shown as element 18 with an SFDR of 90 dB requires the output of the anti-alias filter 16 to have an SFDR of at least 90 dB. Similarly, the output of the ADC driver 14 and the output of the RF receiver 12 each require an SFDR of at least 90 dB.

One way of achieving high SFDR for an RF system, shown in FIG. 1A, is to use an ADC driver 14 with very low distortion and an anti-alias filter using passive components such as inductors (L) and capacitors (C), also referred to as an LC filter. The low distortion ADC driver 14 dissipates a lot of power on the order of 1-2 Watts. The anti-alias LC filter is typically very large physically. Both the high power consumption and the large filter size make this approach undesirable.

An additional source of high power consumption arises from the need to impedance match the separate components in FIG. 1A with a fifty-ohm reference. Specifically, the RF receiver 12 and the ADC driver 14 are matched with a fifty ohm reference 20, the anti-alias filter 16 and the ADC driver 14 are matched with a fifty ohm reference 22 and the ADC 18 and the anti-alias filter 16 are matched with a fifty ohm reference 24. A fifty-ohm reference is typically needed or any interconnect that has an electrical length longer than approximately one tenth of the wavelength of the highest frequency tone in a Fourier transform of the propagated signal. This fact motivates integrating the various components onto a monolithic semiconductor chip.

A second way of achieving high SFDR for an RF system, is to use a surface acoustic waver (SAW) filter 34 shown in FIG. 1B in place of the LC filter 16 shown in FIG. 1A. A SAW filter consumes less physical space than an LC filter, however the SAW filter suffers from significant pass-band signal loss. For example, a SAW filter with a 40 MHz bandwidth and a 90 dB stop-band rejection may attenuate the pass-band signal by more than 20 dB. This attenuation, requires the ADC driver 38 in FIG. 1B to have higher gain to compensate for the loss, which increases power consumption and complexity. ADC manufacturers have responded by integrating the ADC driver 38 with the ADC 40 in a single integrated circuit 36 (IC or "chip").

Several approaches attempt to reduce the power consumption from the fifty-ohm references. In FIG. 1C, the RF receiver and the anti-alias filter 54 are integrated into a single IC 52. The ADC driver 58 and the ADC 60 are also integrated into a single IC 56. A single fifty-ohm reference 62 is required between the two ICs 52 and 56. An alternative arrangement shown in FIG. 1D integrates the anti-alias filter 74, ADC driver 76 and the RF receiver in a single IC 72. The IC 72 then drivers the ADC 78 through a fifty-ohm reference 80.

A typical measure of nonlinearity used in RF systems is the third order intercept ($OIP_3$, $IP_3$ or TOI). The $OIP_3$ is used to measure the effect of third order products in the bandwidth of interest, typically including the fundamental frequency (tone). FIG. 2 further illustrates the relevance of the third order products. For example, the fundamental f1 102 and f2 104 create second order products 106 and 108 from the sum and difference of the f1 102 and f2 104 frequencies. Similarly, third order products 110 and 112 are created from the sum and difference of the second order harmonic which occurs at twice the frequency of f1 102 and f2 104. The difference signal (2f2−f1) is spectrally close to the fundamental f2 thus it is used in the computation of $OIP_3$ to represent the nonlinearity of the system. A large $OIP_3$ represents a more linear system.

With reference to FIG. 1A, if the desired signal level at the input of the ADC 18 for a maximum signal-to-noise ration (SNR) is 0 dBm, the nonlinearity of the anti-alias filter 16, ADC driver 14 and RF receiver 12 must be higher than 45 dBm. Table 1 compares typical results of anti-alias filters with a 3 dB bandwidth of at least 1 MHz, implemented in a silicon IC. Although the filters listed in Table 1 are not integrated with an RF receiver and an ADC they can be integrated because they are implemented in a CMOS technology. The linearity of the three systems as measured by their respective $OIP_3$ (e.g. 18.5 dBm, 19.5 dBm and 24 dBm) each falls short of the required level of 45 dBm.

TABLE 1

Typical anti-alias filter performance

| Anti-alias filter | $OIP_3$ In-band | 3 dB cut-off frequency | Gain | Stop-band rejection | Input referred noise | Power | Technology |
|---|---|---|---|---|---|---|---|
| #1 | 19.5 dBm | 1.92 MHz | 8.5 dB | 63 dB | Integrated 46 uVrms | 11.6 mW | 0.8 μm BiCMOS |
| #2 | 24 dBm | 1, 2.2 or 11 MHz | −6 −> 68 dB | Not reported | 5 nV/√Hz | 55 mW | 0.13 μm CMOS |
| #3 (Low pass portion) | 18.5 dBm | 15 MHz | 0 dB | 60 dB | 15.2 nV/√Hz or 50 nV/√Hz for low power | 184.8 mW or 17.8 mW | 0.6 μm CMOS |

BRIEF SUMMARY

In one aspect, the invention features a method for digital compensation of a nonlinear system comprising identifying a plurality of circuit parameters of a nonlinear system. Each circuit parameter determines a nonlinear response of the nonlinear system. A first circuit parameter is chosen from the plurality of circuit parameters. The first circuit parameter determines a first effect on the nonlinear response. The firs effect is at least as large as a second effect from a second circuit parameter from the plurality of circuit parameters. At least one stimulus is applied to the nonlinear system. The nonlinear response of the nonlinear system is measured in response to the at least one stimulus. A compensation architecture is synthesized to substantially linearize the nonlinear response. The compensation architecture receives the nonlinear response of the nonlinear system and provides a substantially linear response.

In another aspect, the invention features a computer program product for digital compensation of a nonlinear system. The computer program product comprises a computer readable storage medium having computer readable program code embodied therewith. The computer readable program code comprises computer readable program code configured to identify a plurality of circuit parameters of a nonlinear system. Each circuit parameter determines a nonlinear response of the nonlinear system. Computer readable program code is configured to choose a first circuit parameter from the plurality of circuit parameters. The first circuit parameter determines a first effect on the nonlinear response. The first effect is at least as large as a second effect from a second circuit parameter from the plurality of circuit parameters. Computer readable program code is configured to apply at least one stimulus to the nonlinear system. Computer readable program code is configured to measure the nonlinear response of the nonlinear system in response to the at least one stimulus. Computer readable program code is configured to synthesize a compensation architecture to substantially linearize the nonlinear response. The compensation architecture receives the nonlinear response of the nonlinear system and provides a substantially linear response.

In another aspect, the invention features a method for digital compensation of a nonlinear system comprising identifying a plurality of circuit parameters of a nonlinear system. Each circuit parameter determines a nonlinear response of the nonlinear system. A first circuit parameter is chosen from the plurality of circuit parameters. The first circuit parameter determines a first effect on the nonlinear response. The first effect is at least as large as a second effect from a second circuit parameter from the plurality of circuit parameters. At least one stimulus is applied to the nonlinear system. The nonlinear response of the nonlinear system is measured in response to the at least one stimulus. A compensation architecture is synthesized to substantially linearize the nonlinear response. The compensation architecture receives the nonlinear response of the nonlinear system and provides a substantially linear response. The steps of modifying the first circuit parameter, applying at least one stimulus, measuring the nonlinear response and synthesizing the compensation architecture are repeated until the total power limit is substantially reduced.

BRIEF DESCRIPTION OF THE SEVERAL VIEWS OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

The digital compensation approach described herein optimizes an entire system comprising analog and digital components rather than treating the analog component as a "black box" independent of the digital component (e.g. digital compensator). The sources of nonlinearity and other non-ideal characteristics (e.g. noise) are identified and digital compensation is designed in parallel with the design of the analog component, thereby making the digital compensation very power-efficient. For example a nonlinear system comprising a radio frequency (RF) component can be simultaneously optimized for one or more parameters including linearity, noise and power consumption. Various systems take advantage of this approach including a fully integrated RF receiver on a monolithic CMOS chip with a homodyne receiver, a frequency synthesizer, an ADC and a digital compensator. Other examples of systems include a homodyne receiver with digitally compensated I/Q mismatch and a wide tuning range frequency synthesizer with digital compensation to achieve low phase noise.

Embodiments of a digital compensation method and apparatus described herein provide for integrated components with improved linearity and minimized overall power consumption. In one embodiment, the integrated components include an RF receiver, an ADC driver, an anti-alias filter, an ADC or any combination thereof, followed by a digital compensator. In another embodiment, the integrated components include any nonlinear components followed by a digital compensator. In another embodiment, the integrated components include a plurality of groups of circuits, wherein each group includes at least one nonlinear circuit followed by a digital compensator. Such nonlinear systems typically include non-linear polynomial distortion and a final analog to digital conversion, although they are not limited to such. In one example, a nonlinear system is converted to the digital domain, a digital compensation is performed and the resulting compensated digital output is converted back to the analog domain.

In a conventional RF system nonlinearities must be equalized while maintaining a high SFDR, low total system power and without occupying a large area. The solutions shown in FIGS. 1A-1D do not satisfy the required power and area constraints, as further illustrated in Table 1. A digital compensator consumes power and area by itself, but can be used in conjunction with a nonlinear analog system to reduce the total power and area of the RF system. Typically, the analog system and the digital compensator are integrated into a monolithic semiconductor although the concepts described herein also apply to systems with separate components or to hybrid systems using multi-chip modules for example.

Figure 1A:
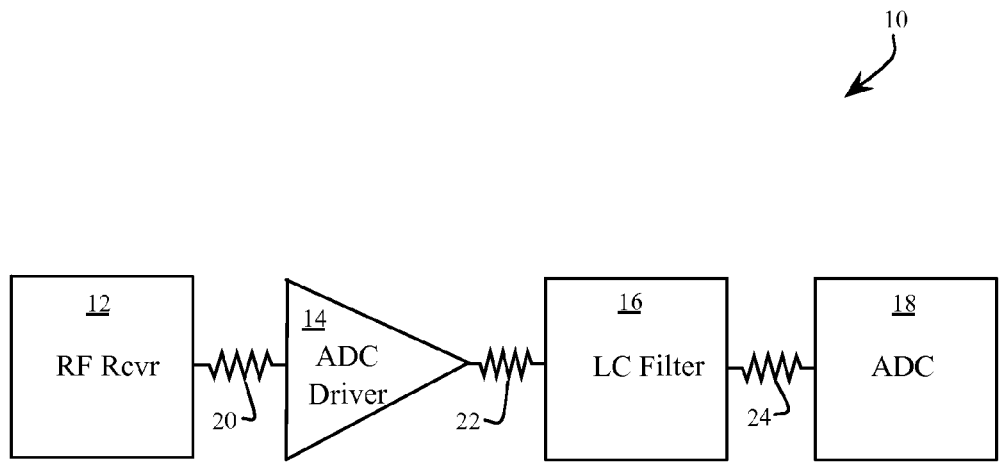
FIG. 1A is a schematic view of a conventional receiver with an LC filter.
Figure 1B:
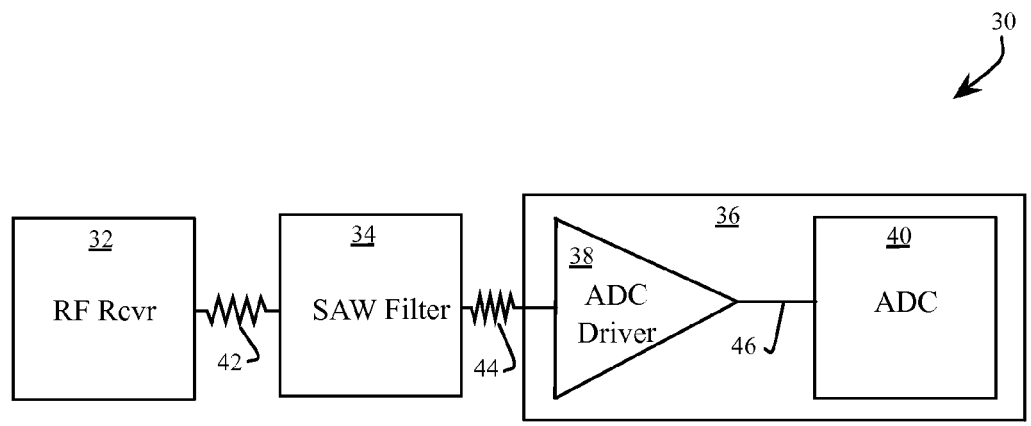
FIG. 1B is a schematic view of a conventional receiver with a SAW filter.
Figure 1C:
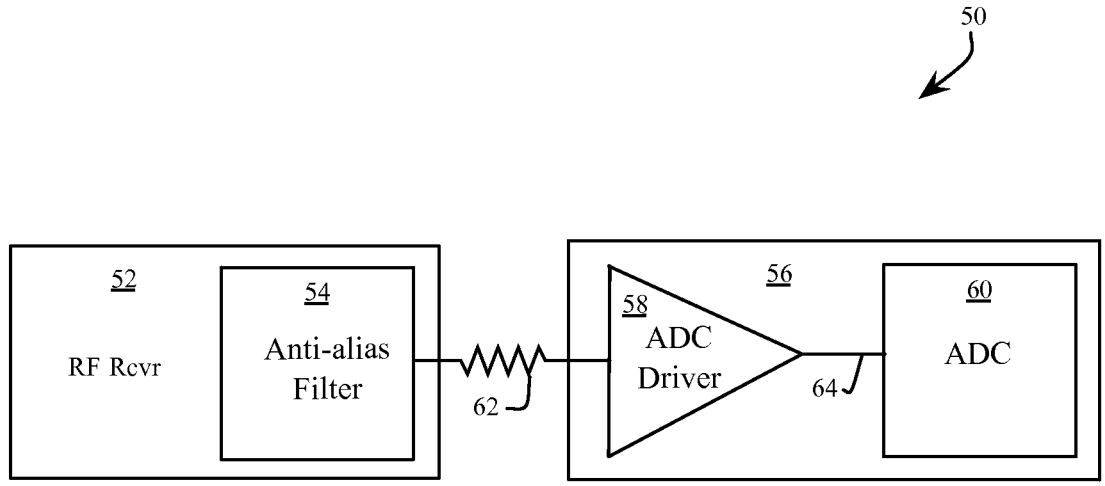
FIG. 1C is a schematic view of a conventional receiver with an anti-alias filter integrated with an RF receiver.
Figure 1D:
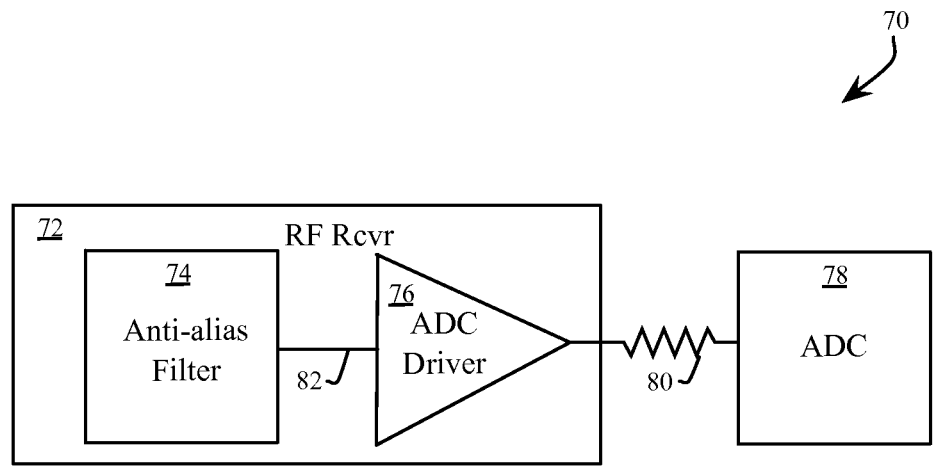
FIG. 1D is a schematic view of the conventional receiver with an anti-alias filter and an ADC driver integrated with an RF receiver.
Figure 2:
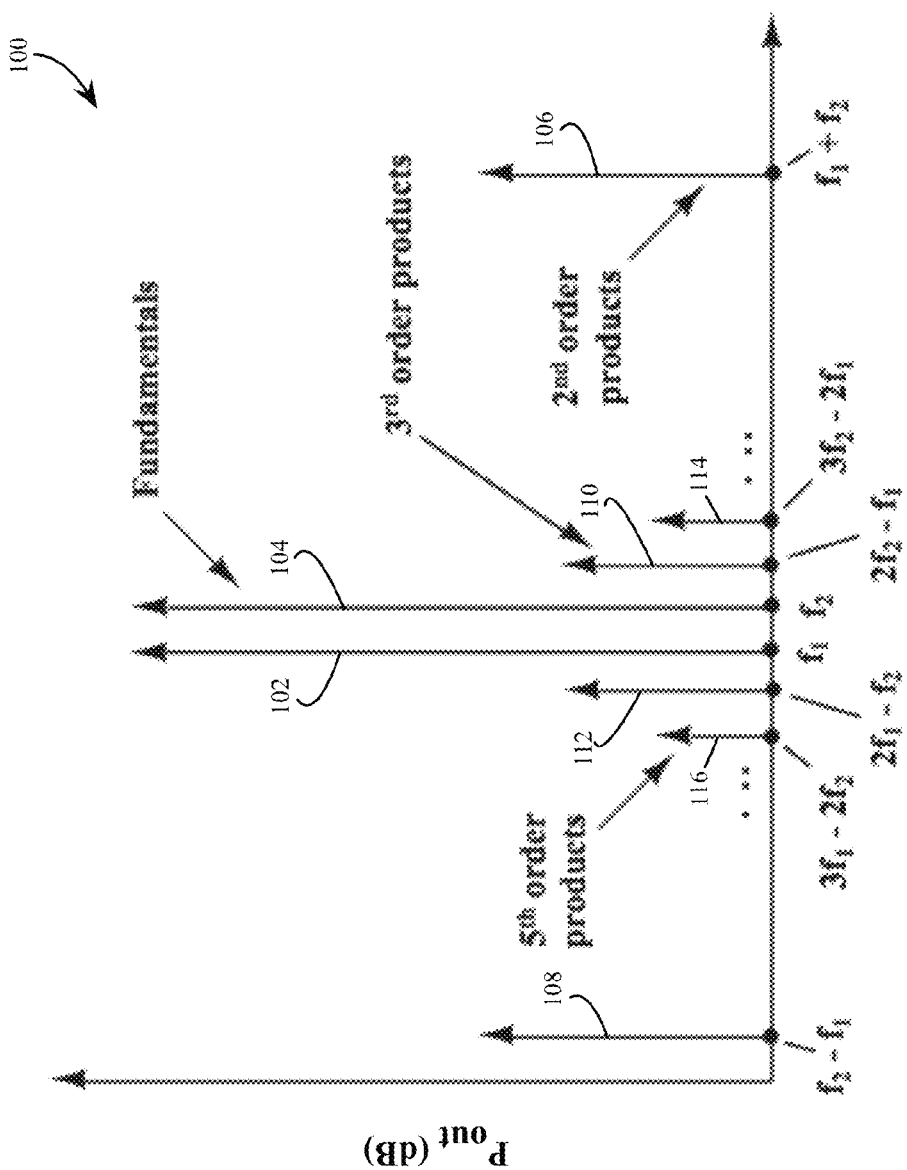
FIG. 2 is a graph of fundamental tones and associated harmonic tones.
Figure 3:
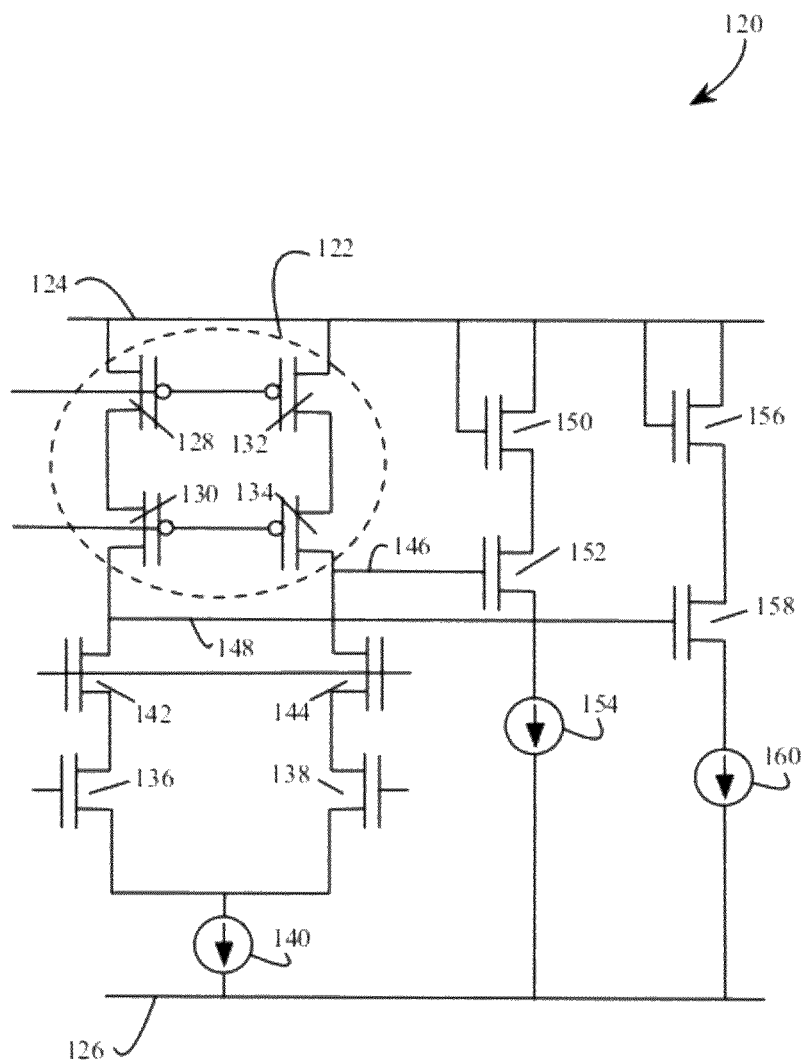
FIG. 3 is schematic view of a simplified operational amplifier with a cascode active load in an open loop configuration.

In a system integrated into a monolithic semiconductor (integrated), the anti-alias filter is typically implemented with either an operational amplifier (op-amp) based resistor-capacitor (RC) architecture or with a transconductance amplifier (gmC) architecture. A gmC filter can operate at higher frequencies than the op-amp based RC filter because the gmC filter operates without feedback (open-loop). In contrast, the op-amp based RC filter can provide higher SFDR if the op-amp has a large loop gain and unity-gain bandwidth. For example, a fifth-order Chebyshev filter with a 30 MHz passband typically requires an op-amp with a unity gain bandwidth exceeding 18 GHz and a corresponding op-amp loop gain of at least 30 dB. Referring to FIG. 3, if the supply voltage 124 is reduced to save power, or a CMOS implementation is used rather than BiCMOS, the transconductance will be lowered resulting in a reduction of the loop gain below 30 dB. This further degrades the required $OIP_3$ level below 45 dBm. Although the cascode active load boosts gain it also contributes to significant nonlinearity and a corresponding reduction in the $OIP_3$ level.

Referring to FIG. 3, a typical CMOS op-amp 120 operates between an upper supply voltage 124 and a lower supply voltage 126. A cascode load 128 is formed by PMOS transistors 128, 130, 132 and 134. An input transistor 136 and a complementary input transistor 138 each sink current through the current bias 140 from the cascode load 122 to provide an output 146 and a complementary output 148. A pair of transistors 142 and 144 can decouple the cascode load 122 and the transistors 136 and 138 to reduce power when the op-amp 120 is inactive. The output 146 is buffered by transistor 152, a load 150 and a current source 154. Similarly, the complementary output 148 is buffered by transistor 158, a load 156 and a current source 160.

A nonlinear characteristic is a deviation from a linear relationship between an input and an output of a system or circuit. A weak nonlinear response is manifest as an output with harmonics and intermodulation terms as well as the fundamental tone of interest. If the nonlinearity becomes stronger, the gain of the fundamental tone will be reduced and more energy will transfer to the harmonics and intermodulation terms. Although using a digital compensator can reduce many nonlinear effects, memory effects in the circuit make compensation more difficult. Memory effects change the nonlinear behavior of the circuit based on the state circuit. For example, hysteresis, delays and filtering effects can cause the nonlinear behavior of the circuit to change over time. Other issues that cause memory effects are device (e.g. transistor) heating and trapping effects. Digital compensation of memory effects can be accomplished in part with delay elements that change the compensation as a function of time.

Figure 4:
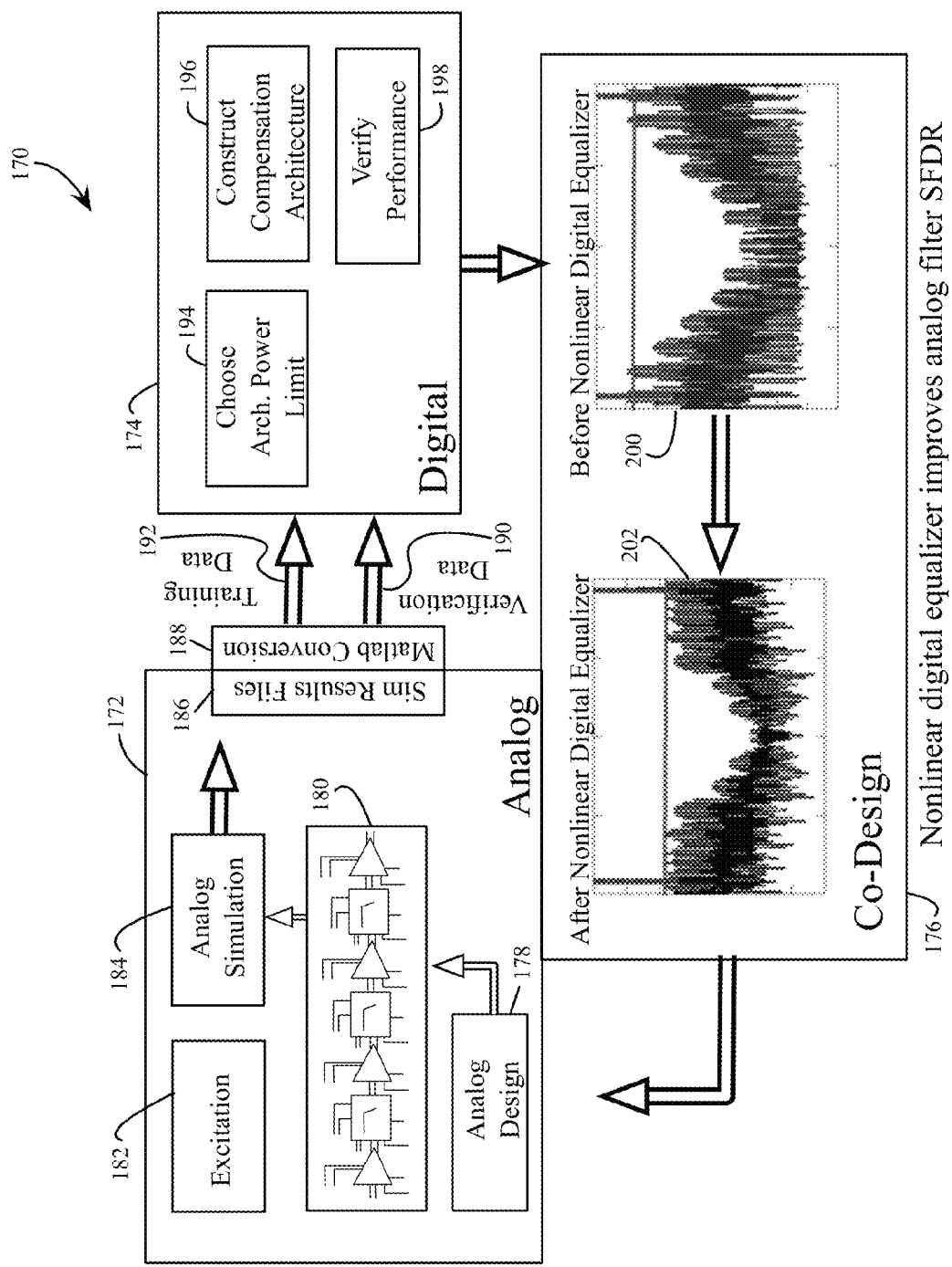
FIG. 4 is a schematic view of a design process for a digital compensation system.

The design process 170 shown in FIG. 4 is a new approach to designing a nonlinear system with a digital compensator that satisfies the need for a power and space efficient system with a nonlinearity substantially equal to the required 45 dBm level described above. The approach includes iteratively performing analog design 172 of a nonlinear system 180, performing digital design 174 of digital compensator (or equalizer) and comparing 176 the nonlinear distortion of the nonlinear system 180 before adjusting the digital compensator 200 with the nonlinear distortion after adjusting the digital compensator 202 until the desired nonlinearity levels are achieved.

The analog design 172 of the nonlinear system 180 includes designing 178 the various circuits of the nonlinear system 180, applying a stimulus or excitation 182 to the nonlinear system 180, simulating 184 the output of the nonlinear system 180 in response to the excitation 182 and capturing simulation results files 186. The simulation results files 186 are converted 188, with MATLAB™ for example, into training data 192 and verification data 190. The digital design 174 includes choosing an architecture power limit 194 for the combination of the nonlinear system 180 and the digital compensator, constructing 196 the digital compensator and verifying 198 the performance of the digital compensator by simulating the output of the digital compensator to determine if the nonlinear effects of the nonlinear system 180 are properly equalized.

The design process 170 is iterative beginning with identifying nonlinear circuit parameters (e.g. the cascode load 122 in FIG. 3). Next, a series of frequency tones (or stimuli or excitation) are chosen to maximize the nonlinear behavior of the chosen circuit parameters and applied as excitation 182 to the nonlinear system 180. In one example, the circuit parameters are sorted to first choose the circuit parameter with the most significant nonlinear effect on the nonlinear system 180. After stimulating the most significant circuit parameter and generating a digital compensation circuit, the reduction of nonlinearity and the total system power consumption are measured. The complexity of the digital compensation circuit is proportional to the amount of nonlinearity being compensated. A highly nonlinear circuit will require more complex compensation and accordingly higher power consumption from the digital compensation circuit. If the total system power target is not met, the nonlinear circuit parameter is either made more linear or less linear resulting in a simpler (and lower power) digital compensator or a more complex digital compensator respectively. For example, a bias current is increased thereby improving the gain and linearity of an analog nonlinear system but also increasing the power consumption of the analog nonlinear system. By iteratively adjusting the nonlinear circuit parameter and then constructing a digital compensator the nonlinearity of the nonlinear system can be satisfied while reducing the total system power because an optimal balance of power consumption between the analog and digital circuits is achieved.

If the total system power consumption is not met after iteratively adjusting the most significant nonlinear circuit parameter and reconstructing the digital compensator, the next most significant nonlinear circuit parameter is chosen and iterated upon in the same manner as the first nonlinear circuit parameter. One or more circuit parameters are iteratively adjusted until the total power consumption and nonlinear performance goals are met. In another example, the order of nonlinear circuit parameters is chosen based on how significantly each circuit parameter affects the analog nonlinear system power consumption rather than nonlinearity.

The applied excitation 182 is a series of frequency tones in one example, with the nonlinearity measured as the total harmonic distortion of the nonlinear system. In another example, the excitation 182 is a series of closely spaced frequency tone pairs with the nonlinearity measured as the third order intercept. In one embodiment, the pair of frequency tones is ramped from 3 MHz to 40 MHz with a tone spacing of 0.08 MHz to 20 MHz producing 124 sets of tones.

Figure 5:
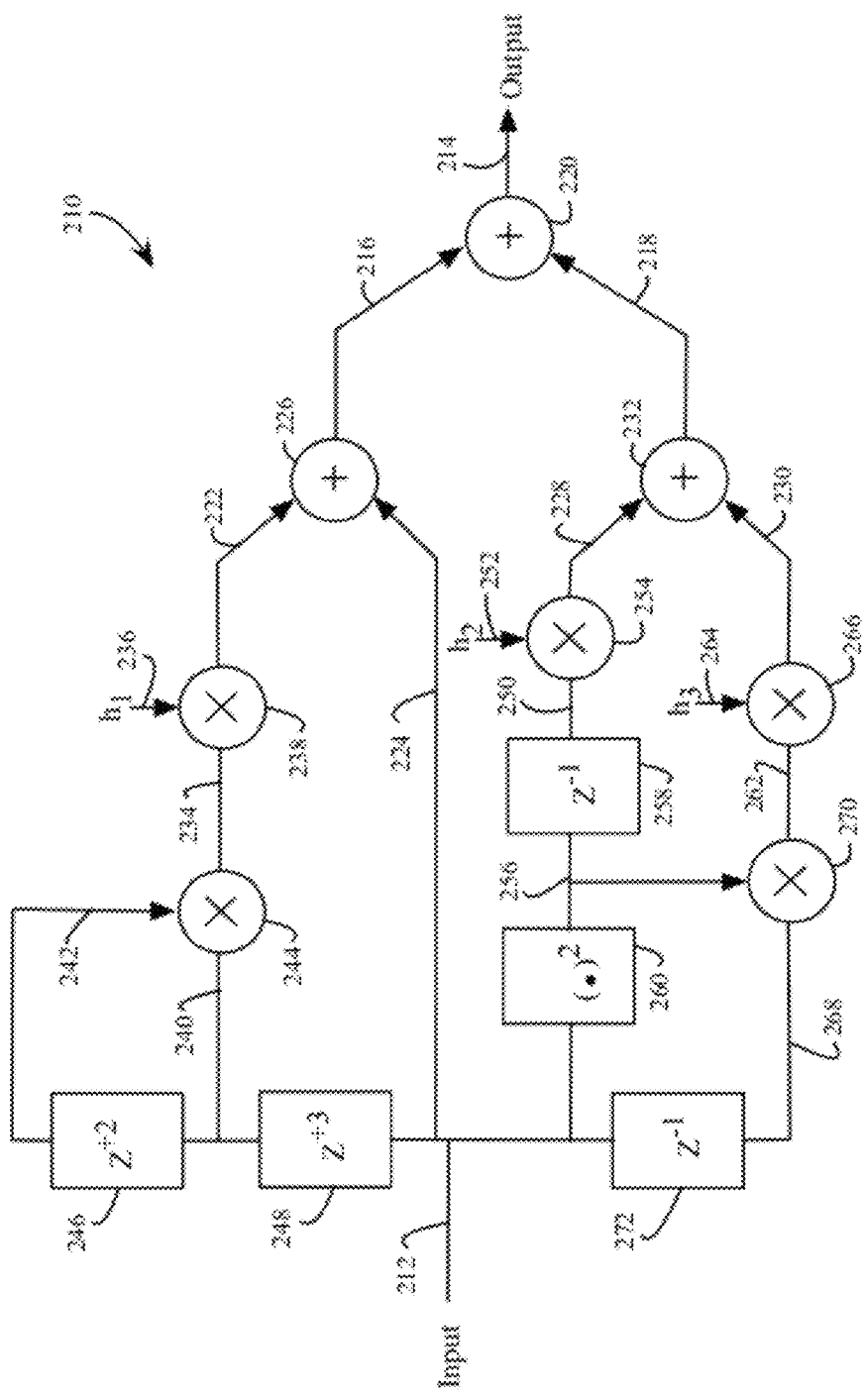
FIG. 5 is a schematic view of a polyphase nonlinear equalizer architecture for a digital compensator.

FIG. 5 shows a digital compensator 210 used in one of the preferred embodiments. The digital compensator 210 comprises the weighted sum of products of time-delayed values from the output of the nonlinear system 180. Accordingly, the digital compensator 210 captures the harmonic and intermodulation terms as well as the corresponding memory effects. Reduction of memory effects is desirable because the complexity and power consumption of the digital compensator grows rapidly with increased memory effects. In the design process 170 shown in FIG. 4, the analog nonlinear system 180 is preferentially designed to reduce memory effects through choice of architecture and components for example. The reduction of memory effects permits the reduction of digital compensator coefficients to the space of the generalized memory polynomial, although other coefficient spaces can be used. For example, a Volterra kernel can also be used. The Volterra kernel is a highly comprehensive nonlinear model but is combinatorial thus not well suited for real-time implementation. The generalized memory polynomial is further reduced in complexity by using a constrained optimization procedure to select the individual coefficients. A number of optimization procedures are used in various embodiments, including greedy techniques and convex optimization techniques.

The digital compensator 210 in FIG. 5 has an input 212, which communicates with the output of the nonlinear system 180. The digital compensator 210 produces an output 214, which is a substantially linearized version of the output of the nonlinear system 180. In the embodiment shown in FIG. 5, the output 214 is the sum 220 of values 216 and 218. The value 216 is the sum 226 of values 222 and 224. The value 222 is the product 238 of value 234 and coefficient 236. The value 234 is the product 244 of value 240 and 242. The value 242 is a time advanced 246 of 240. The value 240 is a time advanced 248 of input 212. Time advancement is relative to the sampling time of input 212, so the time advance 246 and 248 are accomplished by a corresponding delay in input 212. The value 224 is considered a "feed through" path while the 222 value is a "second order" path because it is derived from the input 212 multiplied twice (once by 244 and once by 238). The value 218 is the sum 232 of values 228 and 230. The value 228 is the product 254 of value 250 and coefficient 252. The value 250 is a time delay 258 of value 256. The value 256 is the square product 260 of input 212. The value 230 is the product 266 of value 262 and coefficient 264. The value 262 is the product 270 of value 256 and 268. The value 268 is a time delay 272 of the input 212. The value 230 is a "third order" path because the value 230 is multiplied three times (once by 266, once by 270 and once by 260).

Figure 6A:
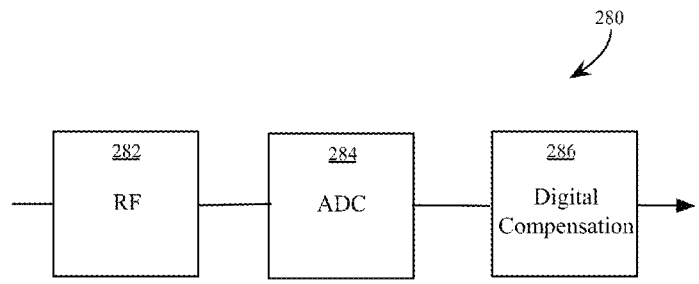
FIG. 6A is a schematic view of a nonlinear receiver with a digital compensator.
Figure 6B:
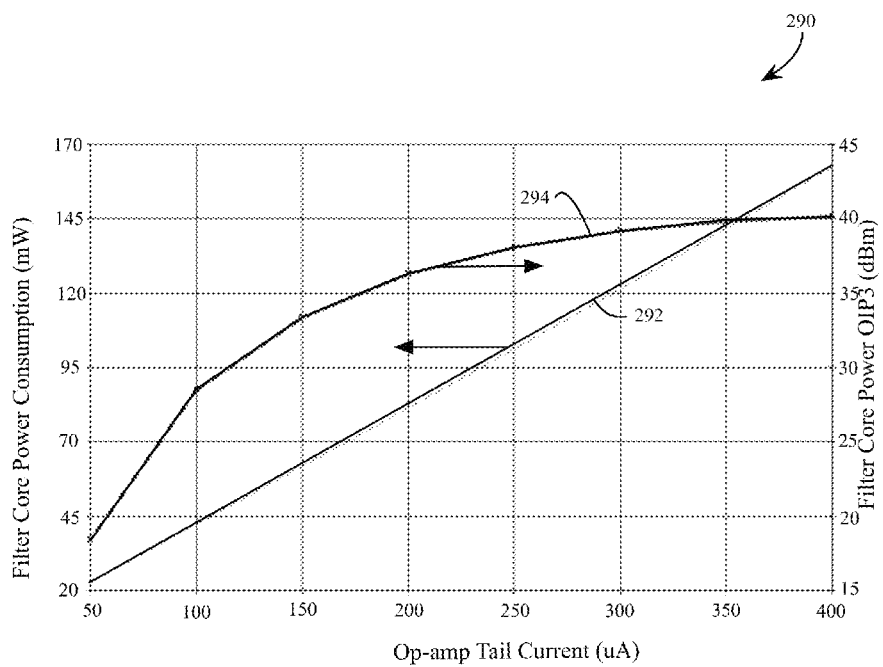
FIG. 6B is a graph view of a power consumption and third order intercept of an uncompensated nonlinear receiver.

FIG. 6A is a generalized version of a nonlinear system comprising an RF receiver 282 and an ADC 284 followed by a digital compensator 286. FIG. 6B shows the tradeoff of power consumption and improved linearity for an nonlinear system (e.g. the operational amplifier in FIG. 3). As the op-amp tail current (e.g. current source 140 in FIG. 3) is increased, the op-amp power consumption 292 increases linearly however the improvement in linearity 294 is sublinear. Although large values of op-amp tail current will marginally improve linearity and will result in a correspondingly marginal reduction in the digital compensator power, the total system power will be very large.

Figure 7:
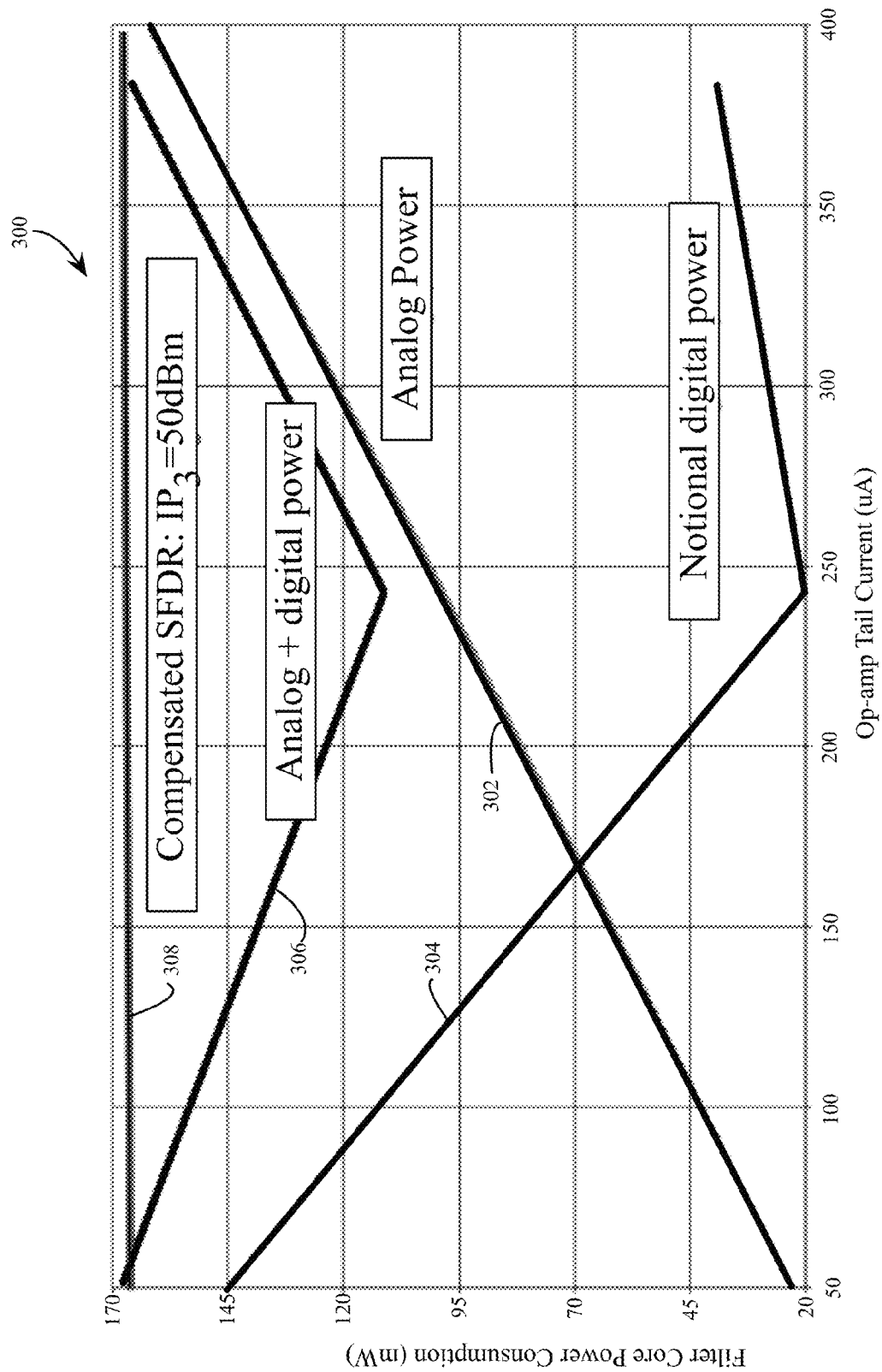
FIG. 7 is graph view of a power consumption of a nonlinear system and a digital compensator.

FIG. 7 further illustrates the tradeoff of analog and digital design parameters. For a given post-compensated linearity 308 of 50 dBm as measured by the third order intercept, the combined system consumes power due to the nonlinear analog system and the digital compensator. The analog power 302 increases linearly with an increase in the op-amp tail current. The notional digital power 304 decreases with an increase in op-amp tail current because the analog system nonlinearity improves and memory effects are reduced because of a corresponding improvement in unity gain bandwidth. The improvement in notional digital power 304 reaches an inflection point and degrades at very high levels of op-amp tail current. In this example, the total system power 306 including the nonlinear analog system and the digital compensator achieves minimum power at an op-amp tail current of approximately 240 uA.

Table 2 compares the performance of continuous time filters shown in Table 1 with the applicant's work. Specifically, the low pass filter is improved to an $OIP_3$ value of 36.5 dBm and further improved to an $OIP_3$ value of 43.6 dBm with the addition of the digital compensator (e.g. nonlinear digital equalizer).

TABLE 2

Typical anti-alias filter performance compared to Applicant's work

| Anti-alias filter | OIP$_3$ In-band | 3 dB cut-off frequency | Gain | Stop-band rejection | Input referred noise | Power | Technology |
|---|---|---|---|---|---|---|---|
| #1 | 19.5 dBm | 1.92 MHz | 8.5 dB | 63 dB | Integrated 46 uVrms | 11.6 mW | 0.8 μm BiCMOS |
| #2 | 24 dBm | 1, 2.2 or 11 MHz | −6 −> 68 dB | Not reported | 5 nV/√Hz | 55 mW | 0.13 μm CMOS |
| #3 (Low pass portion) | 18.5 dBm | 15 MHz | 0 dB | 60 dB | 15.2 nV/√Hz or 50 nV/√Hz for low power | 184.8 mW or 17.8 mW | 0.6 μm CMOS |
| Applicant's work | 36.5 dBm | 28.2 MHz | 49 dB | 92 dB | 8.4 nV/√Hz | 79 mW (filter only) | 0.13 um SiGe BiCMOS |
| Applicant's work with nonlinear digital equalizer | 43.6 dBm | 28.2 MHz | 49 dB | 92 dB | 8.4 nV/√Hz | 81.7 mW (filter + nonlinear digital equalizer) | 0.13 um SiGe BiCMOS |

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire-line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the invention has been shown and described with reference to specific preferred embodiments, it should be understood by those skilled in the art that various changes in form and detail may be made therein without departing from the spirit and scope of the invention as defined by the following claims.

What is claimed is:

1. A method for digital compensation of a nonlinear system comprising:
    identifying a plurality of circuit parameters of a nonlinear system, each circuit parameter determining a nonlinear response of the nonlinear system;
    choosing a first circuit parameter from the plurality of circuit parameters, the first circuit parameter determining a first effect on the nonlinear response, the first effect being at least as large as a second effect from a second circuit parameter from the plurality of circuit parameters;
    applying at least one stimulus to the nonlinear system;
    measuring the nonlinear response of the nonlinear system in response to the at least one stimulus; and
    synthesizing a compensation architecture to substantially linearize the nonlinear response, the compensation architecture receiving the nonlinear response of the nonlinear system and providing a substantially linear response;
    measuring a combined performance parameter of the nonlinear system and the compensation architecture; and
    iteratively adjusting the compensation architecture until the combined performance parameter is less than a target combined performance and the nonlinear response is less than a target nonlinear response.

2. The method of claim 1 wherein applying the at least one stimulus includes applying at least one single tone and wherein measuring the nonlinear response includes measuring a total harmonic distortion of the nonlinear system.

3. The method of claim 1 wherein applying the at least one stimulus includes applying at least one pair of tones and wherein measuring the nonlinear response includes measuring a third order intercept of the nonlinear system.

4. The method of claim 1 wherein synthesizing the compensation architecture includes using a constrained optimization to construct a polyphase equalization filter.

5. The method of claim 1 wherein the combined performance parameter is a total power limit of the nonlinear system and the compensation architecture.

6. The method of claim 5 further comprising modifying the first circuit parameter and performing the steps of applying at least one stimulus, measuring the nonlinear response and synthesizing the compensation architecture iteratively until the total power limit is less than a target value.

7. The method of claim 5 further comprising modifying the first circuit parameter and performing the steps of applying at least one stimulus, measuring the nonlinear response and synthesizing the compensation architecture iteratively until the total power limit is substantially reduced.

8. The method of claim 7 further comprising choosing a third circuit parameter from the plurality of circuit parameters, the third circuit parameter determining a third effect on the nonlinear response, the third effect being at least as large as the second effect from the second circuit parameter from the plurality of circuit parameters.

9. The method of claim 1 wherein the plurality of circuit parameters are chosen to substantially eliminate memory effects.

10. The method of claim 1 wherein the compensation architecture is restricted to a generalized memory polynomial.

11. A computer program product for digital compensation of a nonlinear system, the computer program product comprising:
    a non-transitory computer readable storage medium having computer readable program code embodied therewith, the computer readable program code comprising:
    computer readable program code configured to identify a plurality of circuit parameters of a nonlinear system, each circuit parameter determining a nonlinear response of the nonlinear system;
    computer readable program code configured to choose a first circuit parameter from the plurality of circuit parameters, the first circuit parameter determining a first effect on the nonlinear response, the first effect being at least as large as a second effect from a second circuit parameter from the plurality of circuit parameters;
    computer readable program code configured to apply at least one stimulus to the nonlinear system;
    computer readable program code configured to measure the nonlinear response of the nonlinear system in response to the at least one stimulus;
    computer readable program code configured to synthesize a compensation architecture to substantially linearize the nonlinear response, the compensation architecture receiving the nonlinear response of the nonlinear system and providing a substantially linear response;
    computer readable program code configured to measure a combined performance parameter of the nonlinear system and the compensation architecture; and
    computer readable program code configured to iteratively adjust the compensation architecture until the combined performance parameter is less than a target combined performance and the nonlinear response is less than a target nonlinear response.

12. The computer program product of claim 11 wherein the computer readable program code further comprises computer readable program code configured to apply the at least one stimulus as at least one single tone and configured to measure the nonlinear response as a total harmonic distortion of the nonlinear system.

13. The computer program product of claim 11 wherein the computer readable program code further comprises computer readable program code configured to apply the at least one stimulus as at least one pair of tones and configured to measure the nonlinear response as a third order intercept of the nonlinear system.

14. The computer program product of claim 11 wherein the computer readable program code further comprises computer readable program code configured to synthesize the compensation architecture by using a constrained optimization to construct a polyphase equalization filter.

15. The computer program product of claim 11 wherein the computer readable program code further comprises computer readable program code wherein the combined performance parameter is a total power limit of the nonlinear system and the compensation architecture.

16. The computer program product of claim 15 wherein the computer readable program code further comprises computer readable program code configured to modify the first circuit parameter and to execute the steps of applying at least one stimulus, measuring the nonlinear response and synthesizing the compensation architecture iteratively until the total power limit is less than a target value.

17. The computer program product of claim 15 wherein the computer readable program code further comprises computer readable program code configured to modify the first circuit parameter and to execute the steps of applying at least one stimulus, measuring the nonlinear response and synthesizing the compensation architecture iteratively until the total power limit is substantially reduced.

18. The computer program product of claim 17 wherein the computer readable program code further comprises computer readable program code configured to choose a third circuit parameter from the plurality of circuit parameters, the third circuit parameter determining a third effect on the nonlinear response, the third effect being at least as large as the second effect from the second circuit parameter from the plurality of circuit parameters.

19. The computer program product of claim 11 wherein the computer readable program code further comprises computer readable program code configured to choose the plurality of circuit parameters to substantially eliminate memory effects.

20. A method for digital compensation of a nonlinear system comprising:
   identifying a plurality of circuit parameters of a nonlinear system, each circuit parameter determining a nonlinear response of the nonlinear system;
   choosing a first circuit parameter from the plurality of circuit parameters, the first circuit parameter determining a first effect on the nonlinear response, the first effect being at least as large as a second effect from a second circuit parameter from the plurality of circuit parameters;
   applying at least one stimulus to the nonlinear system;
   measuring the nonlinear response of the nonlinear system in response to the at least one stimulus;
   synthesizing a compensation architecture to substantially linearize the nonlinear response, the compensation architecture receiving the nonlinear response of the nonlinear system and providing a substantially linear response;
   measuring a total power limit of the nonlinear system and the compensation architecture; and
   iteratively adjusting the compensation architecture until the total power limit is less than a target combined performance and the nonlinear response is less than a target nonlinear response.

* * * * *

UNITED STATES PATENT AND TRADEMARK OFFICE
CERTIFICATE OF CORRECTION

| | | |
|---|---|---|
| PATENT NO. | : 8,644,437 B2 | Page 1 of 1 |
| APPLICATION NO. | : 13/227583 | |
| DATED | : February 4, 2014 | |
| INVENTOR(S) | : Kim et al. | |

It is certified that error appears in the above-identified patent and that said Letters Patent is hereby corrected as shown below:

In the Claims:

In claim 1, column 11, line 48:

delete the word "and" from the phrase "in response to the at least one stimulus; and"

Signed and Sealed this
Tenth Day of June, 2014

Michelle K. Lee
*Deputy Director of the United States Patent and Trademark Office*